United States Patent
Gao et al.

(10) Patent No.: US 12,048,173 B2
(45) Date of Patent: Jul. 23, 2024

(54) LIGHT EMITTING DEVICE AND DISPLAYING DEVICE

(71) Applicant: BOE Technology Group Co., Ltd., Beijing (CN)

(72) Inventors: Rongrong Gao, Beijing (CN); Dongxu Zhang, Beijing (CN); Yuqian Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 610 days.

(21) Appl. No.: 17/344,864

(22) Filed: Jun. 10, 2021

(65) Prior Publication Data

US 2022/0085314 A1     Mar. 17, 2022

(30) Foreign Application Priority Data

Sep. 15, 2020    (CN) .......................... 202010968842.1

(51) Int. Cl.
    *H01L 51/50*       (2006.01)
    *H10K 50/11*       (2023.01)
    (Continued)

(52) U.S. Cl.
    CPC ............. *H10K 50/11* (2023.02); *H10K 50/15* (2023.02); *H10K 50/16* (2023.02); *H10K 50/171* (2023.02);
    (Continued)

(58) Field of Classification Search
None
See application file for complete search history.

(56) References Cited

U.S. PATENT DOCUMENTS

2016/0322582 A1    11/2016   Qiu et al.
2018/0013073 A1     1/2018   Duan et al.
(Continued)

FOREIGN PATENT DOCUMENTS

CN      104716268 A     6/2015
CN      105895810 A     8/2016
(Continued)

OTHER PUBLICATIONS

CN 202010968842.1 first office action.

*Primary Examiner* — Gregory D Clark
(74) *Attorney, Agent, or Firm* — IPro, PLLC

(57) ABSTRACT

A light emitting device and a displaying device. The light emitting device includes a luminescent layer, wherein the luminescent layer includes a thermally activated delayed-fluorescence material; the thermally activated delayed-fluorescence material includes a donor group, a receptor group and a linking group; the donor group and the receptor group bond to the linking group; and a torsion angle between a plane where the donor group is located and a plane where the linking group is located is θ1, and a torsion angle between a plane where the receptor group is located and the plane where the linking group is located is θ2; wherein θ1 and θ2 enable an energy-level difference between a singlet-state energy level of the thermally activated delayed-fluorescence material and a triplet-state energy level of the thermally activated delayed-fluorescence material to be less than a constant quantity T, wherein 0 eV<T<0.3 eV.

20 Claims, 4 Drawing Sheets

(51) Int. Cl.
  *H10K 50/15* (2023.01)
  *H10K 50/16* (2023.01)
  *H10K 50/17* (2023.01)
  *H10K 59/35* (2023.01)
  *H10K 85/60* (2023.01)
  *H10K 101/10* (2023.01)
  *H10K 101/40* (2023.01)

(52) U.S. Cl.
  CPC ......... *H10K 59/353* (2023.02); *H10K 85/654* (2023.02); *H10K 85/6572* (2023.02); *H10K 2101/10* (2023.02); *H10K 2101/40* (2023.02)

(56) References Cited

U.S. PATENT DOCUMENTS

2020/0161561 A1   5/2020   Luo et al.
2020/0331924 A1   10/2020  Monkman et al.
2020/0339546 A1*  10/2020  Wang .................. H10K 85/636
2021/0355376 A1   11/2021  Luo

FOREIGN PATENT DOCUMENTS

| CN | 109134446 A | 1/2019 |
| CN | 109293661 A | 2/2019 |
| CN | 109369723 A | 2/2019 |
| CN | 111393448 A | 7/2020 |
| CN | 111566111 A | 8/2020 |

* cited by examiner

LIGHT EMITTING DEVICE AND DISPLAYING DEVICE

CROSS REFERENCE TO RELEVANT APPLICATIONS

The present disclosure claims the priority of the Chinese patent application filed on Sep. 15, 2020 before the Chinese Patent Office with the application number of 202010968842.1 and the title of "LIGHT EMITTING DEVICE AND DISPLAYING DEVICE", which is incorporated herein in its entirety by reference.

TECHNICAL FIELD

The present disclosure relates to the technical field of displaying, and particularly relates to a light emitting device and a displaying device.

BACKGROUND

Organic Light Emitting Diode (OLED) light emitting devices have been extensively applied due to their excellent performances. The luminescence modes of OLED light emitting devices include phosphorescent luminescence and fluorescent luminescence.

All of the singlet-state excitons and the triplet-state excitons generated when a phosphorescent-luminescence material is excited can emit light when transit to the ground state, so the internal quantum efficiency (IQE) of OLED light emitting devices based on phosphorescent luminescence reaches 100%. Fluorescent-luminescence materials, when excited, generate singlet-state excitons and triplet-state excitons at a ratio of 25:75, wherein the 25% of singlet-state excitons, when transit to the ground state, emit fluorescence, and the 75% of triplet-state excitons, when transit to the ground state, do not emit light.

SUMMARY

The embodiments of the present disclosure provide a light emitting device and a displaying device.

The embodiments of the present disclosure employ the following technical solutions:

In an aspect, there is provided a light emitting device, comprising a luminescent layer, wherein the luminescent layer comprises a thermally activated delayed-fluorescence material;
the thermally activated delayed-fluorescence material comprises a donor group, a receptor group and a linking group;
the donor group and the receptor group bond to the linking group; and
a torsion angle between a plane where the donor group is located and a plane where the linking group is located is θ1, and a torsion angle between a plane where the receptor group is located and the plane where the linking group is located is θ2;
wherein θ1 and θ2 enable an energy-level difference between a singlet-state energy level of the thermally activated delayed-fluorescence material and a triplet-state energy level of the thermally activated delayed-fluorescence material to be less than a constant quantity T, wherein 0 eV<T<0.3 eV.

Optionally, 80°<θ1<100°, and 0°<θ2<20°.
Optionally, 85°<θ1<95°, and 0°<θ2<10°.

Optionally, the donor group comprises an acridine-type group, the receptor group comprises an azine-type group, and the linking group comprises aryl.

Optionally, a general formula of the thermally activated delayed-fluorescence material is:

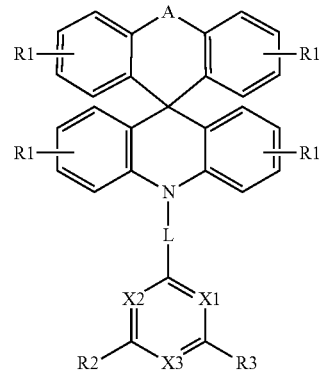

wherein A is any one of a single bond, oxygen, sulphur, aryl and heteroaryl; X1, X2 and X3 are any one of carbon and nitrogen, and at least one of X1, X2 and X3 is nitrogen; R1, R2 and R3 are any one of aryl and heteroaryl; and L is aryl.

Optionally, the luminescent layer further comprises a guest material;
the guest material is doped in the thermally activated delayed-fluorescence material; and
the triplet-state energy level $T1_{TADF}$ of the thermally activated delayed-fluorescence material and a triplet-state energy level $T1_{dopant}$ of the guest material satisfy: $T1_{TADF}-T1_{dopant} \geq 0.4$ eV.

Optionally, the guest material is any one of tris(2-phenylpyridine)iridium, bis(2-hydroxyphenylpyridine) and polymeric polyethylene polypropylene.

Optionally, a doping ratio of the thermally activated delayed-fluorescence material to the guest material is 99:1-80:20.

Optionally, the light emitting device further comprises a cathode and an anode; and
the anode and the cathode are provided on two opposite sides of the luminescent layer.

Optionally, the light emitting device further comprises an electron blocking layer and a hole blocking layer; and
the electron blocking layer is located between the anode and the luminescent layer, and the hole blocking layer is located between the cathode and the luminescent layer.

Optionally, a material of the electron blocking layer is any one of methyl cyclopentenolone, cyclic citrullinated peptide, and 9-phenyl-3,6-bis(9-phenyl-9H-carbazol-3-yl)-9H-carbazole.

Optionally, a range of a thickness of the electron blocking layer is 10 nm-80 nm.

Optionally, a material of the hole blocking layer is any one of 2,9-dimethyl-4,7-biphenyl-1,10-phenanthroline, phenanthroline, and 1,3,5-tris(I-phenyl-1H-benzimidazol-2-yl)benzene.

Optionally, a range of a thickness of the hole blocking layer is 5 nm-10 nm.

Optionally, a highest occupied molecular orbital $HOMO_{TADF}$ of the thermally activated delayed-fluorescence material and a highest occupied molecular orbital $HOMO_{EBL}$ of the electron blocking layer satisfy: $HOMO_{EBL}-HOMO_{TADF} \leq 0.3$ eV; and a lowest unoccupied molecular orbital $LUMO_{TADF}$ of the thermally activated delayed-fluorescence material and a lowest unoccupied molecular orbital $LUMO_{HBL}$ of the hole blocking layer satisfy: $LUMO_{TADF}-LUMO_{HBL} \geq 0.3$ eV.

Optionally, a highest occupied molecular orbital $HOMO_{TADF}$ of the thermally activated delayed-fluorescence material and a highest occupied molecular orbital $HOMO_{HBL}$ of the hole blocking layer satisfy: $HOMO_{TADF}-HOMO_{HBL} \geq 0.1$ eV; and a lowest unoccupied molecular orbital $LUMO_{TADF}$ of the thermally activated delayed-fluorescence material and a lowest unoccupied molecular orbital $LUMO_{EBL}$ of the electron blocking layer satisfy: $LUMO_{TADF}-LUMO_{EBL} \geq 0.1$ eV.

Optionally, a triplet-state energy level of the electron blocking layer is higher than the triplet-state energy level of the thermally activated delayed-fluorescence material; and a triplet-state energy level of the hole blocking layer is higher than the triplet-state energy level of the thermally activated delayed-fluorescence material.

Optionally, the light emitting device further comprises a hole injection layer and a hole transporting layer that are located between the anode and the electron blocking layer, and an electron injection layer and an electron transporting layer that are located between the cathode and the hole blocking layer; and the hole injection layer is located between the anode and the hole transporting layer, and the electron injection layer is located between the cathode and the electron transporting layer.

In another aspect, there is provided a displaying device, wherein the displaying device comprises the light emitting device stated above.

Optionally, the displaying device further comprises a displaying base plate, the displaying base plate comprises a plurality of pixel units that are arranged in an array, each of the pixel units comprises a red-color sub-pixel, a green-color sub-pixel and a blue-color sub-pixel, and the light emitting device comprises a red-color light emitting device, a green-color light emitting device and a blue-color light emitting device that are arranged in an array; and the red-color sub-pixel is electrically connected to the red-color light emitting device, the green-color sub-pixel is electrically connected to the green-color light emitting device, and the blue-color sub-pixel is electrically connected to the blue-color light emitting device.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are merely embodiments of the present disclosure, and a person skilled in the art can obtain other figures according to these figures without paying creative work.

DETAILED DESCRIPTION

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
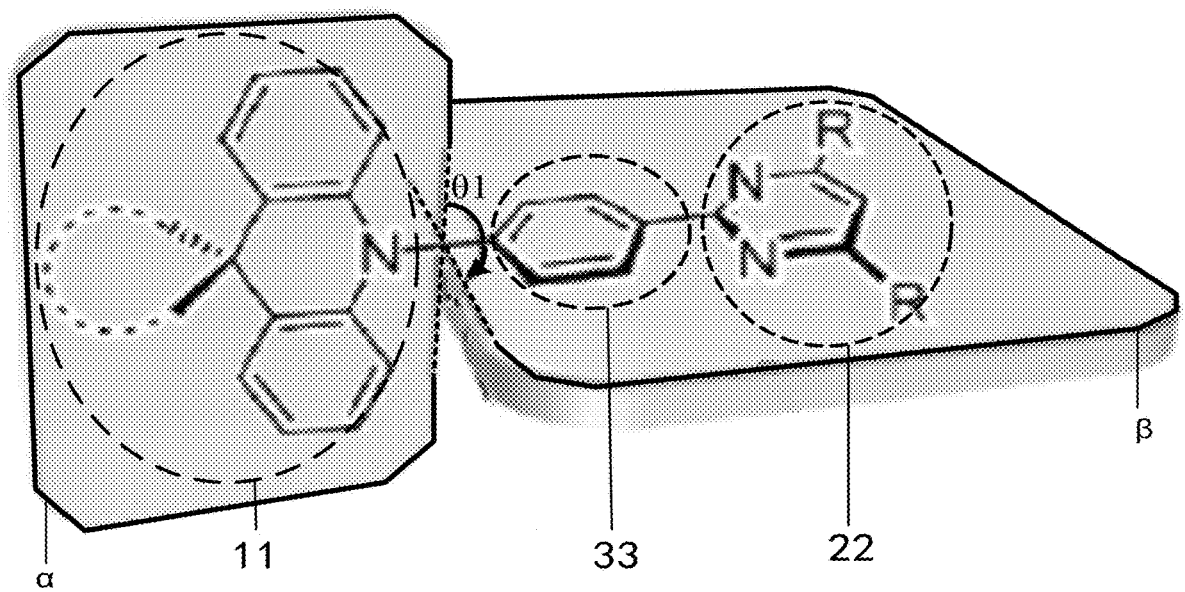
FIG. 1 is a structural formula of the thermally activated delayed-fluorescence material according to an embodiment of the present disclosure.

An embodiment of the present disclosure provides a light emitting device, wherein the light emitting device comprises a luminescent layer, and the luminescent layer comprises a thermally activated delayed-fluorescence material. Referring to FIG. 1, the thermally activated delayed-fluorescence material comprises a donor group 11, a receptor group 22 and a linking group 33.

The donor group 11 and the receptor group 22 bond to the linking group 33. The torsion angle between the plane where the donor group 11 is located and the plane where the linking group 33 is located is θ1, and the torsion angle between the plane where the receptor group 22 is located and the plane where the linking group 33 is located is θ2. θ1 and θ2 enable the energy-level difference ΔEsT between the singlet-state energy level of the thermally activated delayed-fluorescence material and the triplet-state energy level of the thermally activated delayed-fluorescence material to be less than a constant quantity T, wherein 0 eV<T<0.3 eV.

The torsion angle refers to the angle formed by the planes. Referring to FIG. 1, the torsion angle between the plane α where the donor group 11 is located and the plane β where the linking group 33 is located is θ1. In FIG. 1, the illustration takes the case as an example in which the torsion angle θ2 between the plane where the receptor group 22 is located and the plane where the linking group 33 is located is 0°; in this case, the plane where the receptor group 22 is located and the plane where the linking group 33 is located are coplanar.

The particular numerical value of the constant quantity T is not limited herein. As an example, the constant quantity T may be 0.1 eV, 0.2 eV, 0.25 eV and so on.

Figure 2:
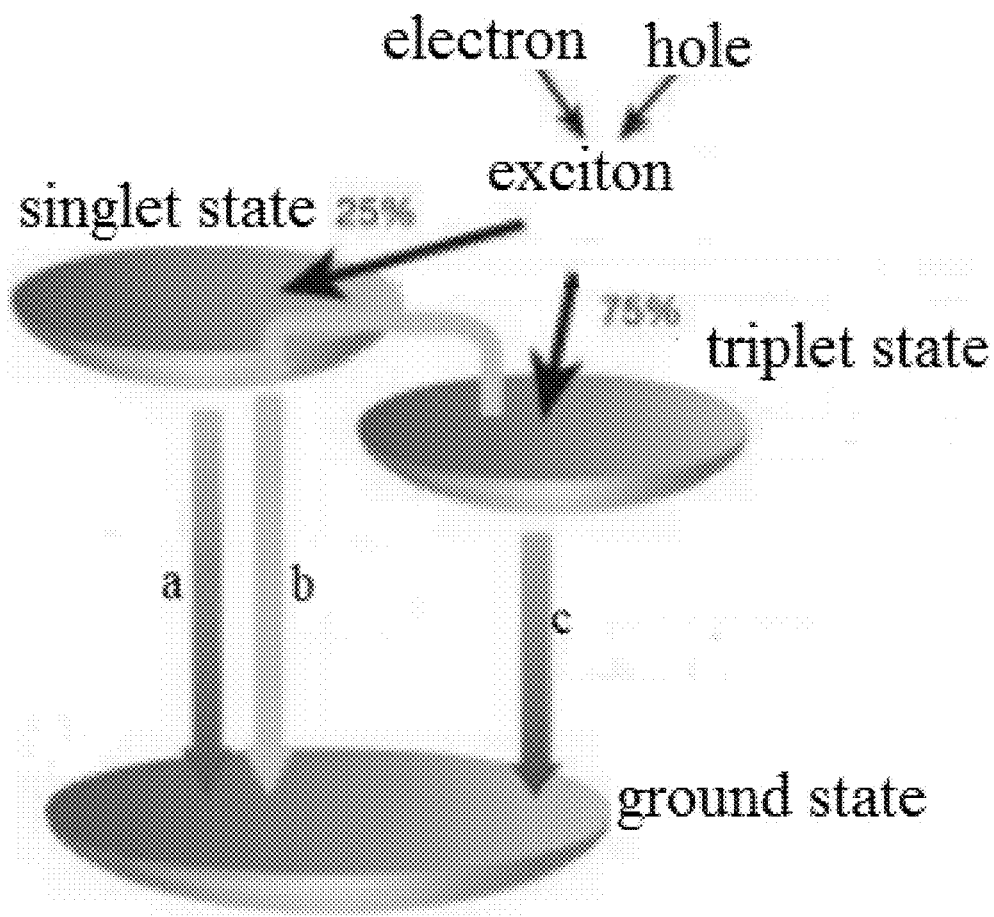
FIG. 2 is a diagram of the luminescence principle of the thermally activated delayed-fluorescence material according to an embodiment of the present disclosure.

Referring to FIG. 2, the thermally activated delayed-fluorescence material (TADF), when excited, generates 25% of singlet-state excitons and 75% of triplet-state excitons, wherein merely the 25% of singlet-state excitons, when transit to the ground state, perform fluorescent luminescence (i.e., the process a), and the 75% of triplet-state excitons, when transit to the ground state, do not perform phosphorescent luminescence (i.e., the process c). However, by configuring, in the thermally activated delayed-fluorescence material, the torsion angle θ1 between the plane where the donor group is located and the plane where the linking group is located, and the torsion angle θ2 between the plane where the receptor group is located and the plane where the linking group is located, the degree of the overlapping between the HOMO electron cloud and the LUMO electron cloud in the thermally activated delayed-fluorescence material is greatly reduced, which in turn enables the energy-level difference between the singlet state and the triplet state in the thermally activated delayed-fluorescence material to be less than the constant quantity T, wherein 0 eV<T<0.3 eV. However, a small energy-level difference between the singlet state and the triplet state facilitates the generation of a reverse intersystem crossing. Accordingly, the 75% of triplet-state excitons in the thermally activated delayed-fluorescence material can more easily perform reverse intersystem crossing to the singlet state to form singlet-state excitons, and the formed singlet-state excitons, when excited, perform fluorescent luminescence (i.e., the process b). In other words, the triplet-state excitons of a high proportion, which originally cannot participate in the luminescence, are converted into singlet-state excitons, which can participate in the luminescence, thereby greatly increasing the utilization ratio of the triplet-state excitons, and in turn effectively improving the luminous efficiency and the luminous performance of the light emitting device.

Optionally, 80°<θ1<100°, and 0°≤θ2<20°. By defining the ranges of the angles θ1 and θ2, the spatial overlapping between the HOMO electron cloud and the LUMO electron cloud in the thermally activated delayed-fluorescence material can be reduced, which in turn enables the energy-level difference ΔEsT between the singlet state and the triplet state in the thermally activated delayed-fluorescence material to be less than the constant quantity T, wherein 0 eV<T<0.3 eV, to increase the luminous efficiency of the light emitting device.

Figure 3:
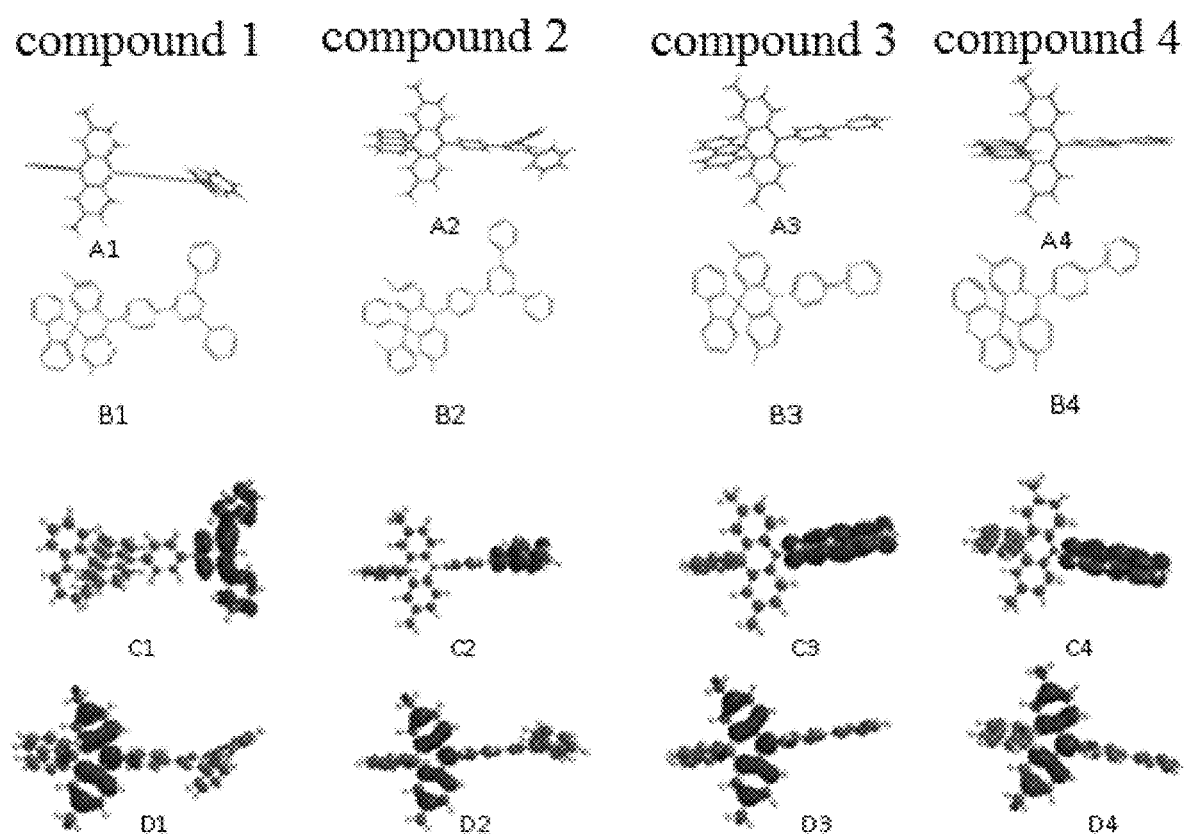
FIG. 3 is diagrams of property characterization of four different thermally activated delayed-fluorescence materials according to an embodiment of the present disclosure.

The particular numerical values of θ1 and θ2 are not limited herein. The structure of the thermally activated delayed-fluorescence material will be described below by taking the compounds 1-4 shown in FIG. 3 as examples.

In the compound 1, θ1=90.79° and θ2=0.66°. In the compound 2, θ1=90.75° and θ2=0.06°. In the compound 3, θ1=90.95° and θ2=0.01°. In the compound 4, θ1=89.93° and θ2=0°. The molecular spatial configurations, the molecular structural formulas, the HOMO electron-cloud models and the LUMO electron-cloud models of the compounds 1-4 refer to A1-A4, B1-B4, C1-C4 and D1-D4 in FIG. 3 respectively.

The molecular spatial configuration refers to the shape of the spatial distribution of the groups or atoms in a molecule. The HOMO electron-cloud model refers to the distribution model of the HOMO electron energy levels in the thermally activated delayed-fluorescence material, and the LUMO electron-cloud model refers to the distribution model of the LUMO electron energy levels in the thermally activated delayed-fluorescence material, wherein HOMO represents the orbit of the highest energy level among the orbits that have been occupied by electrons, and LUMO represents the orbit of the lowest energy level among the orbits that are not occupied by electrons. All of the compounds 1-4 satisfy 80°<θ1<100°, and 0°≤θ2<20°.

The compounds 1-4 are applied to the luminescent layer, to obtain luminescent layers 1-4 respectively, and light emitting devices 1-4 are fabricated by using the luminescent layers 1-4. Each of the light emitting devices 1-4 comprises an anode, a hole injection layer, a hole transporting layer, an electron blocking layer, a luminescent layer, a hole blocking layer, an electron transporting layer, an electron injection layer and a the cathode. The light emitting devices 1-4 are tested, the performance parameters of the light emitting devices 1-4 are obtained as shown in Table 1.

TABLE 1

| compound | PL (nm) | θ1 (°) | θ2 (°) | ΔE$_{ST}$ (meV) | EQE (%) |
|---|---|---|---|---|---|
| compound 1 | 472 | 90.79 | 0.66 | 150 | 15.6 |
| compound 2 | 478 | 90.75 | 0.06 | 180 | 8.2 |
| compound 3 | 472 | 90.95 | 0.01 | 130 | 10.9 |
| compound 4 | 456 | 89.93 | 0 | 150 | 8.4 |

Table 1, PL represents the peak values of the photoluminescence spectra of the compounds 1-4, θ1 represents the torsion angles between the plane where the donor group is located and the plane where the linking group is located in the compounds 1-4, θ2 represents the torsion angles between the plane where the receptor group is located and the plane where the linking group is located in the compounds 1-4, ΔEsT represents the energy-level differences between the singlet state and the triplet state in the compounds 1-4, and EQE represents the external quantum efficiencies of the light emitting devices 1-4.

It can be seen from Table 1 that the EQEs of the light emitting devices 1, 3 and 4 are greater than the EQE of the light emitting device 2. That is because the lower the ΔEsT of the compound, the higher the EQE of the light emitting device. However, regarding the light emitting devices 1 and 4, the same ΔEsT corresponds to the different EQEs of the light emitting devices 1 and 4. That is because the EQEs of the light emitting devices are also influenced by factors such as the carrier mobility in the luminescent layer, and, for the same reason, the EQE of the light emitting device 3 is not the highest, but still can be greater than the EQE of the light emitting device 4.

Optionally, 85°<θ1<95°, and 0°<θ2<10°.

The particular numerical values of θ1 and θ2 are not limited herein. As an example, θ1 is 90°, and θ2 is 0°. At this point, the degree of spatial overlapping between the HOMO electron cloud and the LUMO electron cloud in the thermally activated delayed-fluorescence material is the minimum; in other words, HOMO and LUMO reach the maximum degree of separation, which results in that ΔEsT tends to be very low, whereby the utilization ratio of the excitons in the luminescent layer is the highest, and the luminous efficiency of the light emitting device is the highest.

Optionally, the donor group comprises an acridine-type group, the receptor group comprises an azine-type group, and the linking group comprises aryl.

Optionally, a general formula of the thermally activated delayed-fluorescence material is:

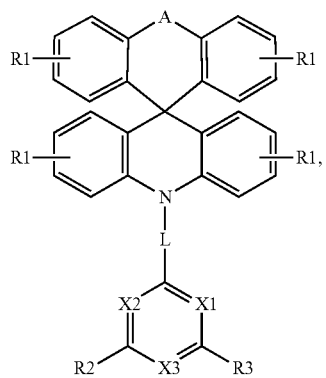

wherein A is any one of a single bond, oxygen, sulphur, aryl and heteroaryl; X1, X2 and X3 are any one of carbon and nitrogen, and at least one of X1, X2 and X3 is nitrogen; R1, R2 and R3 are any one of aryl and heteroaryl; and L is aryl.

Optionally, the luminescent layer further comprises a guest material; the guest material is doped in the thermally activated delayed-fluorescence material; and the triplet-state energy level $T1_{TADF}$ of the thermally activated delayed-fluorescence material and a triplet-state energy level $T1_{dopant}$ of the guest material satisfy: $T1_{TADF} - T1_{dopant} \geq 0.4$ eV. That facilitates to transmit the triplet-state energy in the thermally activated delayed-fluorescence material to the guest material, to increase the luminous efficiency of the light emitting device.

The guest material of the luminescent layer may be any one of Ir(ppy)$_3$, Be(PP)$_2$ and PPF. Herein, the name in English of Ir(ppy)$_3$ is tris(2-phenylpyridine)iridium. The name in English of Be(PP)$_2$ is bis(2-hydroxyphenylpyridine). The name in English of PPF is polymeric polyethylene polypropylene, whose chemical structural formula is

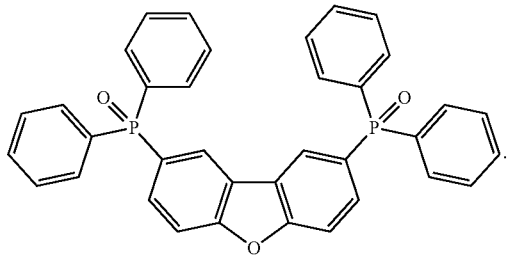 [SMILES: O=P(c1ccccc1)(c1ccccc1)c1ccc2oc3ccc(P(=O)(c4ccccc4)c4ccccc4)cc3c2c1]

The doping ratio of the thermally activated delayed-fluorescence material to the guest material is 99:1-80:20.

Figure 4:
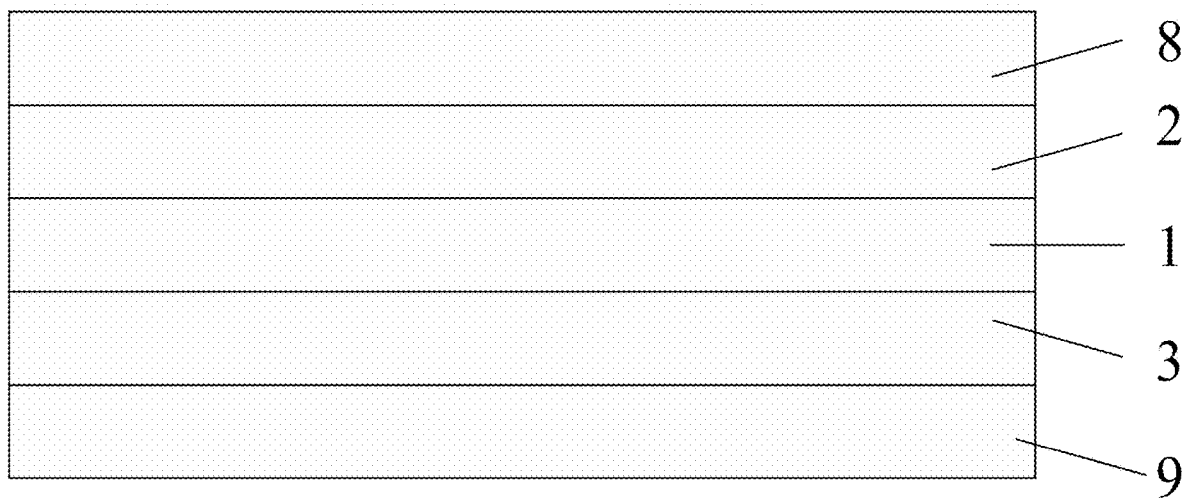
FIG. 4 is a schematic structural diagram of the light emitting device according to an embodiment of the present disclosure.

Optionally, referring to FIG. 4, the light emitting device further comprises a cathode 8 and an anode 9, wherein the anode 9 and the cathode 8 are placed on the two opposite sides of the luminescent layer 1; and the light emitting device further comprises an electron blocking layer 3 and a hole blocking layer 2, wherein the electron blocking layer 3 is located between the anode 9 and the luminescent layer 1, and the hole blocking layer 2 is located between the cathode 8 and the luminescent layer 1.

The material of the electron blocking layer may be any one of mCP, CCP and Tris-PCz. Herein, the name in English of mCP is methyl cyclopentenolone. The name in English of CCP is cyclic citrullinated peptide, whose chemical structural formula is

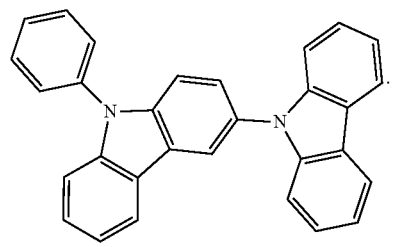 [SMILES: c1ccc(-n2c3ccccc3c3cc(-n4c5ccccc5c5ccccc54)ccc32)cc1]

The name in English of Tris-PCz is 9-phenyl-3,6-bis(9-phenyl-9H-carbazol-3-yl)-9H-carbazole, whose chemical structural formula is

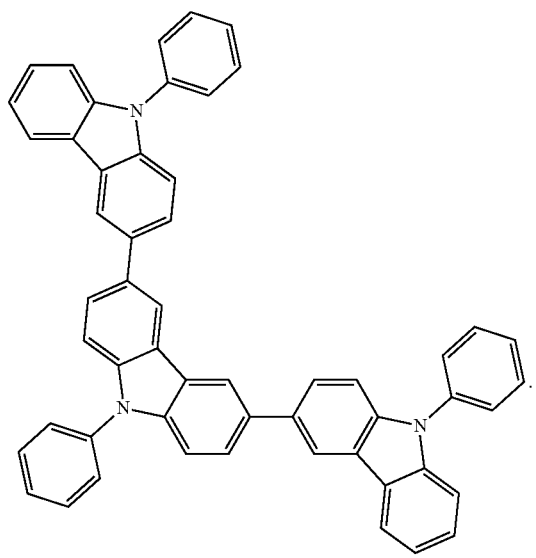 [SMILES: c1ccc(-n2c3ccccc3c3cc(-c4ccc5c(c4)c4cc(-c6ccc7c(c6)c6ccccc6n7-c6ccccc6)ccc4n5-c4ccccc4)ccc32)cc1]

The range of the thickness of the electron blocking layer may be 10 nm-80 nm. As an example, the thickness of the electron blocking layer may be 20 nm, 40 nm, 60 nm, 80 nm and so on.

The material of the hole blocking layer may be any one of BCP, Bphen and TPBI. Herein, the name in English of BCP is 2,9-dimethyl-4,7-biphenyl-1,10-phenanthroline. The name in English of Bphen is phenanthroline. The name in English of TPBI is 1,3,5-tris(1-phenyl-1H-benzimidazol-2-yl)benzene, whose chemical structural formula is

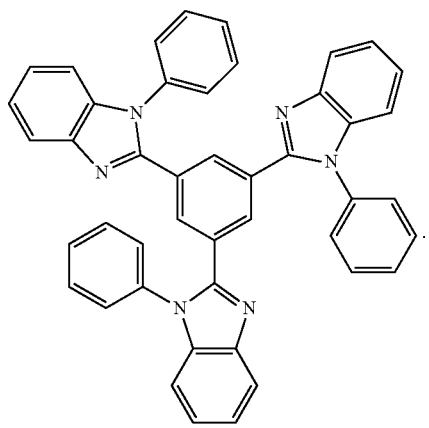 [SMILES: c1ccc(-n2c(-c3cc(-c4nc5ccccc5n4-c4ccccc4)cc(-c4nc5ccccc5n4-c4ccccc4)c3)nc3ccccc32)cc1]

The range of the thickness of the hole blocking layer may be 5 nm-10 nm. As an example, the thickness of the hole blocking layer may be 6 nm, 7 nm, 8 nm, 9 nm and so on.

The electron blocking layer can block the electrons in the luminescent layer from going out of the luminescent layer, to ensure that more electrons recombine with the holes in the luminescent layer, thereby increasing the quantity of the excitons, and in turn increasing the luminous efficiency. The hole blocking layer can block the holes in the luminescent layer from going out of the luminescent layer, to ensure that more holes recombine with the electrons in the luminescent layer, thereby increasing the quantity of the excitons, and in turn increasing the luminous efficiency.

Optionally, a highest occupied molecular orbital $HOMO_{TADF}$ of the thermally activated delayed-fluorescence material and a highest occupied molecular orbital $HOMO_{EBL}$ of the electron blocking layer satisfy: $HOMO_{EBL}-HOMO_{TADF} \leq 0.3$ eV; and a lowest unoccupied molecular orbital $LUMO_{TADF}$ of the thermally activated delayed-fluorescence material and a lowest unoccupied molecular orbital $LUMO_{HBL}$ of the hole blocking layer satisfy: $LUMO_{TADF}-LUMO_{HBL} \leq 0.3$ eV.

In the light emitting device, the energy-level gap between the luminescent layer and the electron blocking layer is reduced, which enables the holes generated by the anode to more easily pass through the electron blocking layer and be transmitted into the luminescent layer, to recombine with the electrons in the luminescent layer to from the excitons, thereby increasing the luminous efficiency. The energy-level gap between the luminescent layer and the hole blocking layer is reduced, which enables the electrons generated by the cathode to more easily pass through the hole blocking layer and be transmitted into the luminescent layer, to recombine with the holes in the luminescent layer to from the excitons, thereby increasing the luminous efficiency.

Optionally, a highest occupied molecular orbital $HOMO_{TADF}$ of the thermally activated delayed-fluorescence material and a highest occupied molecular orbital $HOMO_{HBL}$ of the hole blocking layer satisfy: $HOMO_{TADF}-HOMO_{HBL} \geq 0.1$ eV; and a lowest unoccupied molecular orbital $LUMO_{TADF}$ of the thermally activated delayed-fluorescence material and a lowest unoccupied molecular orbital $LUMO_{EBL}$ of the electron blocking layer satisfy: $LUMO_{TADF}-LUMO_{EBL} \geq 0.1$ eV.

In the light emitting device, the energy-level gap between the luminescent layer and the hole blocking layer is increased, which facilitates to block the holes in the luminescent layer from further migrating to the cathode, and the energy-level gap between the luminescent layer and the electron blocking layer is increased, which facilitates to block the electrons in the luminescent layer from further migrating to the anode, thereby facilitating to restrict the light emitting region within the luminescent layer, prevent the energy of the luminescent layer from diffusing to the peripheral functional layers, and further increase the luminous efficiency of the light emitting device.

Optionally, a triplet-state energy level of the electron blocking layer is higher than the triplet-state energy level of the thermally activated delayed-fluorescence material; and a triplet-state energy level of the hole blocking layer is higher than the triplet-state energy level of the thermally activated delayed-fluorescence material. That can effectively block the electrons and the holes from going out of the luminescent layer, restrict the electrons and the holes within the luminescent layer better, and prevent the energy of the luminescent layer from diffusing to the peripheral functional layers, to further increase the luminous efficiency of the light emitting device.

Figure 5:
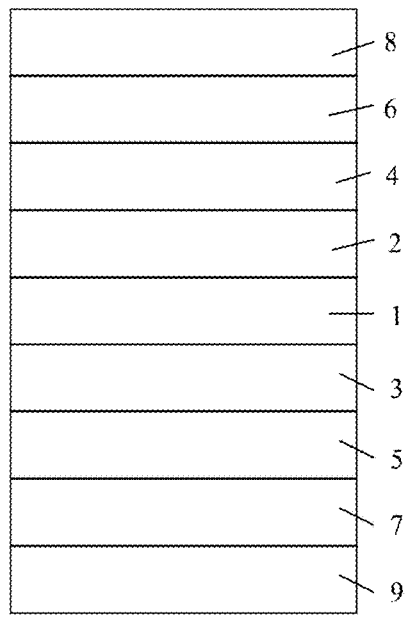
FIG. 5 is a schematic structural diagram of the light emitting device according to another embodiment of the present disclosure.

Optionally, referring to FIG. 5, the light emitting device further comprises a hole injection layer 7 and a hole transporting layer 5 that are located between the anode 9 and the electron blocking layer, and an electron injection layer 6 and an electron transporting layer 4 that are located between the cathode 8 and the hole blocking layer 2. The hole injection layer 7 is located between the anode 9 and the hole transporting layer 5. The electron injection layer 6 is located between the cathode 8 and the electron transporting layer 4.

The material of the hole injection layer may be any one of $MoO_3$, F4-TCNQ and HAT-CN. Herein, the name in English of $MoO_3$ is molybdenum trioxide. The name in English of F4-TCNQ is 2,3,5,6-tetrafluoro-7,7',8,8'-tetracyanodimethylbenzoquinone. The name in English of HAT-CN is 2,3,6,7,10,11-hexacyano-1,4,5,8,9,12-hexaazabenzo-phenanthrene2,3,6,7,110,11, whose chemical structural formula is

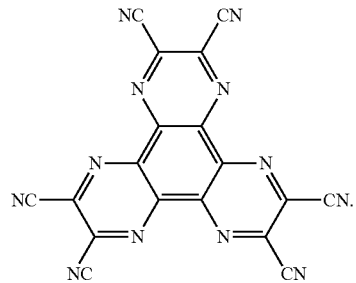

The range of the thickness of the hole injection layer may be 5 nm-30 nm. As an example, the thickness of the hole injection layer may be 6 nm, 10 nm, 15 nm, 20 nm and so on.

The material of the hole transporting layer may be any one of NPB, m-MTDATA and TPD. Herein, the name in English of NPB is N,N'-diphenyl-N,N'-(1-naphthyl)-1,1'-biphenyl-4,4'-diamine, whose chemical structural formula is

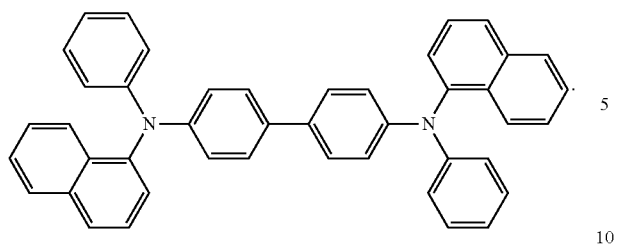

The name in English of m-MTDATA is 4,4',4"-tris[phenyl (m-methylphenyl)amino]trianiline. The name in English of TPD is N,N'-diphenyl-N,N'-bis(3-methylphenyl)-1,1'-biphenyl-4,4'-diamine. The range of the thickness of the hole transporting layer may be 1000 nm-1300 nm. As an example, the thickness of the hole transporting layer may be 1000 nm, 1100 nm, 1200 nm, 1300 nm and so on.

The material of the electron injection layer may be any one of LiF, Yb and Liq. Herein, the name in English of LiF is lithium fluoride. The name in English of Yb is ytterbium. The name in English of Liq is 8-hydroxyquinoline-lithium, whose chemical structural formula is

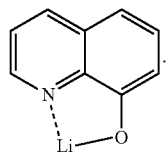

The range of the thickness of the electron injection layer may be nm-3 nm. As an example, the thickness of the electron injection layer may be 1 nm, 2 nm, 3 nm and so on.

The material of the electron transporting layer may be any one of BCP, Bphen and TPBI. Herein, the name in English of BCP is 2,9-dimethyl-4,7-biphenyl-1,10-phenanthroline. The name in English of Bphen is phenanthroline. The name in English of TPBI is 1,3,5-tris(1-phenyl-1H-benzimidazol-2-yl)benzene. The thickness of the electron transporting layer may be 20 nm-35 nm. As an example, the thickness of the electron transporting layer may be 20 nm, 23 nm, 30 nm, 35 nm and so on.

A particular embodiment will be provided below. Referring to FIG. 5, the light emitting device comprises: the anode 9, whose material is ITO and thickness is 100 nm; the hole injection layer 7 located on the anode 9, whose material is HAT-CN and thickness is 10 nm; the hole transporting layer 5 located on the hole injection layer 7, whose material is NPD and thickness is 40 nm; the electron blocking layer 3 located on the hole transporting layer 5, whose material is CCP and thickness is 10 nm; the luminescent layer 1 located on the electron blocking layer 3, wherein the host material of the luminescent layer 1 is the compound 1 (the compound 1 refers to the thermally activated delayed-fluorescence material shown in FIG. 3 whose θ1=90.79° and θ2=0.66°, and its molecular structural formula is

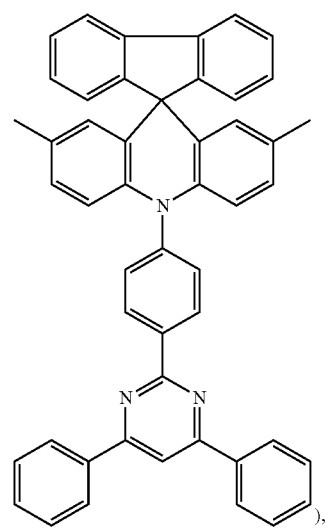 [SMILES: Cc1ccc2c(c1)C1(c3ccccc3-c3ccccc31)c1cc(C)ccc1N2c1ccc(-c2nc(-c3ccccc3)cc(-c3ccccc3)n2)cc1]

the guest material is PPF, the thickness of the guest material is 20 nm, and the doping ratio of the compound 1 to PPF is 99:1; the hole blocking layer 2 located on the luminescent layer 1, whose material is BCP and thickness is 6 nm; the electron transporting layer 4 located on the hole blocking layer 2, whose material is TPBI and thickness is 30 nm; the electron injection layer 6 located on the electron transporting layer 4, whose material is Liq and thickness is 1 nm; and the cathode 8 located on the electron injection layer 6, whose material is Al and thickness is 100 nm.

The above-described light emitting device has a high luminous efficiency.

The light emitting device may be applied to a displaying device. The particular structure of the displaying device is not limited herein.

As an example, the displaying device may comprise a displaying base plate and the light emitting device. The displaying base plate comprises a plurality of pixel units that are arranged in an array, and the light emitting device comprises a red-color light emitting device, a green-color light emitting device and a blue-color light emitting device that are arranged in an array. Each of the pixel units comprises a red-color sub-pixel, a green-color sub-pixel and a blue-color sub-pixel, the red-color sub-pixel is electrically connected to the red-color light emitting device, the green-color sub-pixel is electrically connected to the green-color light emitting device, and the blue-color sub-pixel is electrically connected to the blue-color light emitting device.

Figure 6:
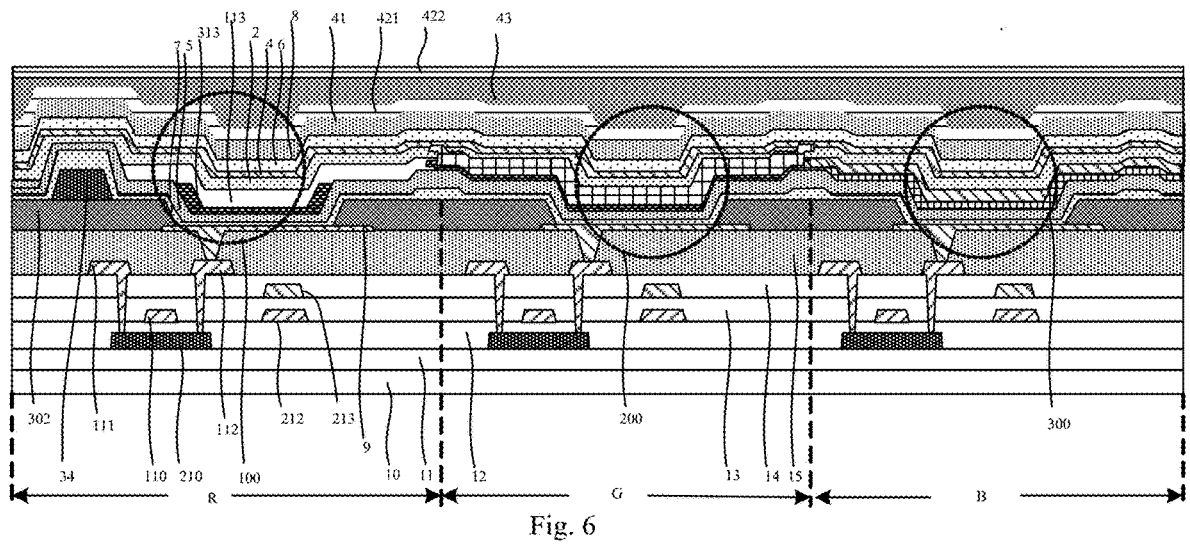
FIG. 6 is a schematic structural diagram of the displaying device according to an embodiment of the present disclosure.

Referring to FIG. 6, the red-color sub-pixel is electrically connected to a red-color light emitting device 100, the green-color sub-pixel is electrically connected to a green-color light emitting device 200, and the blue-color sub-pixel is electrically connected to a blue-color light emitting device 300. Referring to FIG. 6, the particular structure will be described by taking the leftmost red-color sub-pixel as an example. The red-color sub-pixel comprises: a buffer layer 11, an active layer 210, a grid insulating layer 12, a grid metal layer (comprising a grid 110 and a first electrode 212), an insulating layer 13, an electrode layer (comprising a second electrode 213), an inter-layer-medium layer 14, a source-drain metal layer (comprising a source 111 and a drain 112), a flat layer 15 and a pixel defining layer 302 that are located on a substrate 10 and are sequentially stacked. The first electrode 212 and the second electrode 213 are used to form a storage capacitor. The pixel defining layer 302 comprises an opening, the red-color light emitting device 100 is provided in the opening, and the anode 9 of the red-color light emitting device 100 is electrically connected to the drain 112 of the thin-film transistor. The displaying base plate further comprises a separator 34 located on the pixel defining layer 302. It should be noted that, in the displaying base plate, the separator may be provided on part of the pixel defining layer, and may also be provided on the whole pixel defining layer, which is not limited herein.

The red-color light emitting device 100 comprises the anode 9, and the hole injection layer 7, the hole transporting layer 5, the electron blocking layer 313, a red-color luminescent layer 113, the hole blocking layer 2, the electron transporting layer 4, the electron injection layer 6 and the cathode 8 that are located on the anode 9 and are sequentially stacked.

It should be noted that the materials of the luminescent layers of the green-color light emitting device 200 and the blue-color light emitting device 300 shown in FIG. 6 are different from the material of the luminescent layer of the red-color light emitting device 100. The luminescent layer of the green-color light emitting device is used to emit a green light, the luminescent layer of the blue-color light emitting device is used to emit a blue light, and the luminescent layer of the red-color light emitting device is used to emit a red light. In addition, the materials of the electron blocking layers of the green-color light emitting device and the blue-color light emitting device are different from the material of the electron blocking layer of the red-color light emitting device. Except for the luminescent layers and the electron blocking layers, all of the other film layers of the green-color light emitting device and the blue-color light emitting device are the same as those of the red-color light emitting device, and are not discussed herein further.

Referring to FIG. 6, the displaying device may further comprise an optical film layer 41, a first inorganic layer 421, an organic layer 43 and a second inorganic layer 422 that cover the light emitting device. The first inorganic layer 421, the organic layer 43 and the second inorganic layer 422 can serve for packaging, to protect the light emitting device, and prolong the service life.

An embodiment of the present disclosure provides a displaying device, wherein the displaying device comprises the light emitting device according to the above embodiments.

The displaying device may be a flexible displaying device (also referred to as a flexible screen), and may also be a rigid displaying device (i.e., a displaying device that cannot be bent), which is not limited herein. The displaying device may be an Organic Light Emitting Diode (OLED) displaying device, and may also be any products or components having a displaying function that comprise an OLED, such as a television set, a digital camera, a mobile phone and a tablet personal computer. The displaying device has the advantages such as a good displaying effect, a long life, a high stability and a high contrast.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

The above are merely particular embodiments of the present disclosure, and the protection scope of the present disclosure is not limited thereto. All of the variations or substitutions that a person skilled in the art can easily envisage within the technical scope disclosed by the present disclosure should fall within the protection scope of the present disclosure. Therefore, the protection scope of the present disclosure should be subject to the protection scope of the claims.

The invention claimed is:

1. A light emitting device, comprising a luminescent layer, wherein the luminescent layer comprises a thermally activated delayed-fluorescence material;
   the thermally activated delayed-fluorescence material comprises a donor group, a receptor group and a linking group;
   the donor group and the receptor group bond to the linking group; and
   a torsion angle between a plane where the donor group is located and a plane where the linking group is located is θ1, and a torsion angle between a plane where the receptor group is located and the plane where the linking group is located is θ2;
   wherein θ1 and θ2 enable an energy-level difference between a singlet-state energy level of the thermally activated delayed-fluorescence material and a triplet-state energy level of the thermally activated delayed-fluorescence material to be less than a constant quantity T, wherein 0 eV<T<0.3 eV.

2. The light emitting device according to claim 1, wherein 80°<θ1<100°, and 0°≤θ2<20°.

3. The light emitting device according to claim 2, wherein 85°<θ1<95°, and 0°<θ2<10°.

4. The light emitting device according to claim 1, wherein the donor group comprises an acridine-type group, the receptor group comprises an azine-type group, and the linking group comprises aryl.

5. The light emitting device according to claim 4, wherein a general formula of the thermally activated delayed-fluorescence material is:

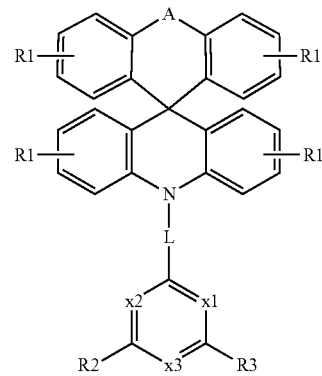

wherein A is any one of a single bond, oxygen, sulphur, aryl and heteroaryl; X1, X2 and X3 are any one of carbon and nitrogen, and at least one of X1, X2 and X3 is nitrogen; R1, R2 and R3 are any one of aryl and heteroaryl; and L is aryl.

6. The light emitting device according to claim 1, wherein the luminescent layer further comprises a guest material;
   the guest material is doped in the thermally activated delayed-fluorescence material; and
   the triplet-state energy level $T1_{TADF}$ of the thermally activated delayed-fluorescence material and a triplet-state energy level $T1_{dopant}$ of the guest material satisfy: $T1_{TADF}-T1_{dopant} \geq 0.4$ eV.

7. The light emitting device according to claim 6, wherein the guest material is any one of tris(2-phenylpyridine) iridium, bis(2-hydroxyphenylpyridine) and polymeric polyethylene polypropylene.

8. The light emitting device according to claim 6, wherein a doping ratio of the thermally activated delayed-fluorescence material to the guest material is 99:1-80:20.

9. The light emitting device according to claim 1, wherein the light emitting device further comprises a cathode and an anode; and
   the anode and the cathode are provided on two opposite sides of the luminescent layer.

10. The light emitting device according to claim 9, wherein the light emitting device further comprises an electron blocking layer and a hole blocking layer; and
    the electron blocking layer is located between the anode and the luminescent layer, and the hole blocking layer is located between the cathode and the luminescent layer.

11. The light emitting device according to claim 10, wherein a material of the electron blocking layer is any one of methyl cyclopentenolone, cyclic citrullinated peptide, and 9-phenyl-3,6-bis(9-phenyl-9H-carbazol-3-yl)-9H-carbazole.

12. The light emitting device according to claim 10, wherein a range of a thickness of the electron blocking layer is 10 nm-80 nm.

13. The light emitting device according to claim 10, wherein a material of the hole blocking layer is any one of 2,9-dimethyl-4,7-biphenyl-1,10-phenanthroline, phenanthroline, and 1,3,5-tris(1-phenyl-1H-benzimidazol-2-yl)benzene.

14. The light emitting device according to claim 10, wherein a range of a thickness of the hole blocking layer is 5 nm-10 nm.

15. The light emitting device according to claim 10, wherein a highest occupied molecular orbital $HOMO_{TADF}$ of the thermally activated delayed-fluorescence material and a highest occupied molecular orbital $HOMO_{EBL}$ of the electron blocking layer satisfy: $HOMO_{EBL}-HOMO_{TADF} \leq 0.3$ eV; and
    a lowest unoccupied molecular orbital $LUMO_{TADF}$ of the thermally activated delayed-fluorescence material and a lowest unoccupied molecular orbital $LUMO_{HBL}$ of the hole blocking layer satisfy: $LUMO_{TADF}-LUMO_{HBL} \leq 0.3$ eV.

16. The light emitting device according to claim 10, wherein a highest occupied molecular orbital $HOMO_{TADF}$ of the thermally activated delayed-fluorescence material and a highest occupied molecular orbital $HOMO_{HBL}$ of the hole blocking layer satisfy: $HOMO_{TADF}-HOMO_{HBL} \geq 0.1$ eV; and
    a lowest unoccupied molecular orbital $LUMO_{TADF}$ of the thermally activated delayed-fluorescence material and a lowest unoccupied molecular orbital $LUMO_{EBL}$ of the electron blocking layer satisfy: $LUMO_{TADF}-LUMO_{EBL} \geq 0.1$ eV.

17. The light emitting device according to claim 10, wherein a triplet-state energy level of the electron blocking layer is higher than the triplet-state energy level of the thermally activated delayed-fluorescence material; and
    a triplet-state energy level of the hole blocking layer is higher than the triplet-state energy level of the thermally activated delayed-fluorescence material.

18. The light emitting device according to claim 10, wherein the light emitting device further comprises a hole injection layer and a hole transporting layer that are located between the anode and the electron blocking layer, and an electron injection layer and an electron transporting layer that are located between the cathode and the hole blocking layer; and
    the hole injection layer is located between the anode and the hole transporting layer, and the electron injection layer is located between the cathode and the electron transporting layer.

19. A displaying device, wherein the displaying device comprises the light emitting device according to claim 1.

20. The displaying device according to claim 19, wherein the displaying device further comprises a displaying base plate, the displaying base plate comprises a plurality of pixel units that are arranged in an array, each of the pixel units comprises a red-color sub-pixel, a green-color sub-pixel and a blue-color sub-pixel, and the light emitting device comprises a red-color light emitting device, a green-color light emitting device and a blue-color light emitting device that are arranged in an array; and
    the red-color sub-pixel is electrically connected to the red-color light emitting device, the green-color sub-pixel is electrically connected to the green-color light emitting device, and the blue-color sub-pixel is electrically connected to the blue-color light emitting device.

* * * * *